United States Patent
Oberai

(10) Patent No.: US 9,430,606 B2
(45) Date of Patent: *Aug. 30, 2016

(54) FAILURE ANALYSIS AND INLINE DEFECT CHARACTERIZATION

(71) Applicant: Synopsys, Inc., Mountain View, CA (US)

(72) Inventor: Ankush Oberai, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/325,294

(22) Filed: Jul. 7, 2014

(65) Prior Publication Data

US 2014/0310670 A1    Oct. 16, 2014

Related U.S. Application Data

(63) Continuation-in-part of application No. 12/985,788, filed on Jan. 6, 2011, now Pat. No. 8,775,979, and a continuation-in-part of application No. 13/539,249, filed on Jun. 29, 2012, now Pat. No. 8,826,209.

(60) Provisional application No. 61/299,952, filed on Jan. 30, 2010, provisional application No. 61/503,289, filed on Jun. 30, 2011.

(51) Int. Cl.
    *G06F 17/50*     (2006.01)
    *G03F 1/00*     (2012.01)
    *G03F 1/36*     (2012.01)

(52) U.S. Cl.
    CPC ....... *G06F 17/5081* (2013.01); *G06F 17/5068* (2013.01); *G03F 1/144* (2013.01); *G03F 1/36* (2013.01); *G06F 17/5045* (2013.01)

(58) Field of Classification Search
    CPC ............... G06F 1/144; G06F 17/5068; G06F 17/5081; G06F 17/5045; G03F 1/36
    USPC .............. 716/50–52, 55, 100, 103, 106–107, 716/110–112, 118–119, 139
    See application file for complete search history.

(56) References Cited

U.S. PATENT DOCUMENTS 6,275,971 B1      8/2001    Levy
6,969,837 B2    11/2005    Ye (Continued)

OTHER PUBLICATIONS

"Magma Camelot CAD Navigation Software Adopted by Analytical Solutions for Failure Analysis," Press Release from Sep. 9, 2009.

(Continued)

*Primary Examiner* — Stacy Whitmore
(74) *Attorney, Agent, or Firm* — Adams Intellex, PLC

(57) ABSTRACT

Defect characterization and failure analysis are useful tools for analyzing and improving fabrication for semiconductor chips. By using a layout and a netlist in combination with images of semiconductors, defects can be identified and analyzed. Electrical simulation can be performed on the netlist, based on the presence of the defect that was detected. Layout geometries where the defect was detected can be binned, and a search can be performed of the remainder of the layout for similar groupings of layout geometries. Various representations of the semiconductor can be cross-mapped, including layout, schematic, and netlist. The presence of certain defects can be correlated to yield, to performance, and to other characteristics.

27 Claims, 14 Drawing Sheets

(56) References Cited

U.S. PATENT DOCUMENTS

| | | |
|---|---|---|
| 7,149,989 B2 | 12/2006 | Lakshmanan et al. |
| 7,847,937 B1 | 12/2010 | Bevis |
| 7,873,204 B2 | 1/2011 | Wihl et al. |
| 7,873,585 B2 | 1/2011 | Izikson |
| 8,194,968 B2 * | 6/2012 | Park .................. G01N 21/8851 382/145 |
| 8,775,979 B2 * | 7/2014 | Oberai .................. G06F 17/50 716/100 |
| 8,826,209 B2 * | 9/2014 | Kramer .............. G06F 17/5081 716/106 |
| 2008/0167829 A1 * | 7/2008 | Park .................. G01N 21/8851 702/81 |
| 2009/0287440 A1 | 11/2009 | Kulkarni |
| 2009/0310870 A1 | 12/2009 | Monkowski |
| 2010/0238433 A1 | 9/2010 | Lange et al. |

OTHER PUBLICATIONS

"Knights Camelot: Camelot is a next-generation CAD navigation system and key component of Magma's Fab Analysis product line," Jul. 2008.

* cited by examiner

FAILURE ANALYSIS AND INLINE DEFECT CHARACTERIZATION

RELATED APPLICATIONS

This application is a continuation-in-part of U.S. patent application "Failure Analysis Using Design Rules" Ser. No. 12/985,788, filed Jan. 6, 2011 which claims the benefit of the U.S. provisional patent application "Failure Analysis Using Design Rules" Ser. No. 61/299,952, filed Jan. 30, 2010. This application is also a continuation-in-part of U.S. patent application "Automated Inline Defect Characterization" Ser. No. 13/539,249, filed Jun. 29, 2012 which claims the benefit of U.S. provisional patent application "Automated Inline Defect Characterization" Ser. No. 61/503,289, filed Jun. 30, 2011. Each of the foregoing applications is hereby incorporated by reference in its entirety.

FIELD OF ART

This application relates generally to failure analysis and more particularly to automated inline defect characterization.

BACKGROUND

Integrated circuit design and fabrication is a vastly complex effort and involves interaction among numerous steps in a manufacturing process. While going through the various steps in the design process, an understanding is required of the limitations of the manufacturing process. Shapes must be designed which can be fabricated so that the desired electronic circuit function is implemented at the resulting end of fabrication. Frequently, millions, hundreds of millions, or even more transistors can exist on a single semiconductor chip. Each transistor is composed of shapes for diffusion, polysilicon, contacts, metallization, and other structures. The ability to design chips with such large numbers of essential transistors can be quite challenging, and as-needed optimization of the circuitry can be a daunting task, even with the help of electronic design automation (EDA) software tools.

Each semiconductor chip includes numerous metal lines of miniscule dimension in close proximity to one another on. Further, there are diffusions, polysilicon shapes, and insulation layers, all of which must be fabricated to exacting tolerances. As technologies have advanced, smaller and smaller dimensions are used in lithography. These smaller dimensions allow for smaller defects to have a greater impact on the operation of the resulting semiconductor chip. A defect can impact a circuit by bridging between two structures, thereby causing a short or resistive short, or even by increasing capacitance between adjacent structures. Defects can enter a semiconductor chip at each step in the fabrication process. No amount of effort will ever eliminate defects from the manufacturing process. Further, failures on semiconductor chips may be the result of random defects or systematic defects on the chips.

SUMMARY

Inline defect characterization involves analyzing a semiconductor wafer at various steps as the wafer progresses through the fabrication process. A computer implemented method for defect characterization is disclosed comprising: importing a layout for a semiconductor circuit; importing a netlist for the semiconductor circuit; obtaining images of a semiconductor chip which comprises the semiconductor circuit during fabrication; detecting a defect in one of the images of the semiconductor chip wherein the defect is at a location on a portion the semiconductor chip that is represented by the layout; and performing electrical analysis of the netlist with the defect which was detected. The method can include cross-mapping between two of a group comprising the netlist, the schematic, and the layout. The method can also include identifying an intersection of nets based on a failure of electrical operation. A critical dimension can be determined, and filtering out of defects smaller than the critical dimension can be performed. The method can include ranking the defect and a second defect based on their impact to operation of the semiconductor circuit.

In some embodiments, the method may further comprise using an uncertainty value for the defect location to determine a range of possible defect locations. The method may further comprise analyzing the possible defect locations for impact to operation of the semiconductor circuit. The method may further comprise determining a cell in the semiconductor circuit in which the defect resides. The method may further comprise extracting nets from the cell. The method may further comprise extracting nets from one or more adjacent cells surrounding the cell. The method may further comprise binning nets within the cell into a group of nets. The cell may be a custom cell. The method may further comprise correlating an impact of the defect on electrical operation of the semiconductor circuit. The method may further comprise searching through the layout for geometries similar to the layout of the portion of the semiconductor chip where the defect was detected.

In embodiments, a computer program product embodied in a non-transitory computer readable medium for defect characterization may comprise: code for importing a layout for a semiconductor circuit; code for importing a netlist for the semiconductor circuit; code for obtaining images of a semiconductor chip which comprises the semiconductor circuit during fabrication; code for detecting a defect in one of the images of the semiconductor chip wherein the defect is at a location on a portion the semiconductor chip that is represented by the layout; and code for performing electrical analysis of the netlist with the defect which was detected. In embodiments, a computer system for defect characterization may comprise: a memory for storing instructions; one or more processors coupled to the memory wherein the one or more processors, when executing the instructions which are stored, are configured to: import a layout for a semiconductor circuit; import a netlist for the semiconductor circuit; obtain images of a semiconductor chip which comprises the semiconductor circuit during fabrication; detect a defect in one of the images of the semiconductor chip wherein the defect is at a location on a portion the semiconductor chip that is represented by the layout; and perform electrical analysis of the netlist with the defect which was detected.

Various features, aspects, and advantages of numerous embodiments will become more apparent from the following description.

BRIEF DESCRIPTION OF THE DRAWINGS

The following detailed description of certain embodiments may be understood by reference to the following figures wherein.

DETAILED DESCRIPTION

Configuration Overview

Figure 1:
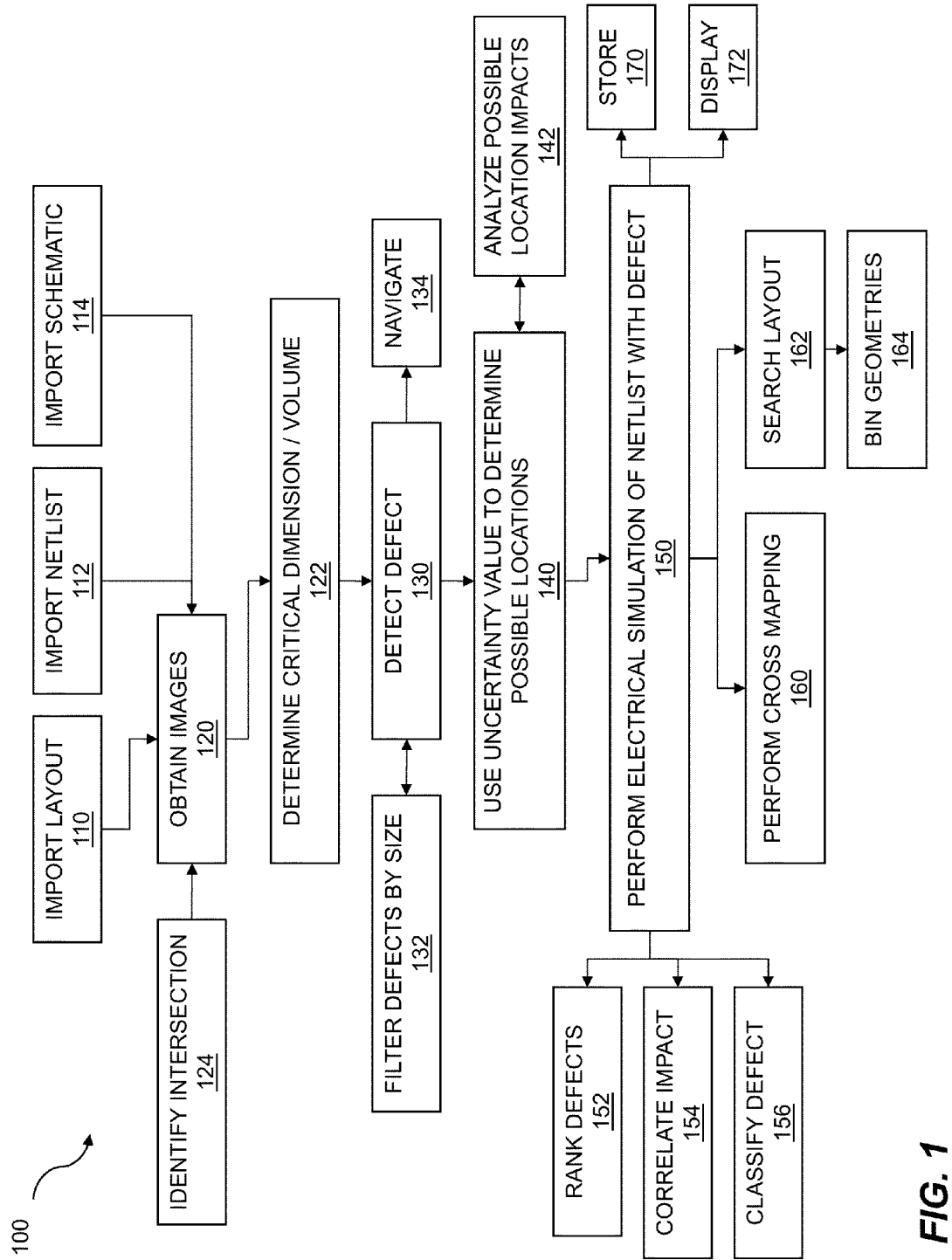
FIG. 1 is a flow diagram for defect characterization.

Defects land on or are created in semiconductor devices at the time of fabrication. These defects are normally only identified once a semiconductor wafer has finished fabrication and a chip fails electrically. The ability to monitor and identify defects during the fabrication process is critical to provide feedback to the manufacturing process. The feedback is used to reduce the identified defects and thereby improve process yield. The present disclosure provides a description of various methods, systems, and apparatus associated with inline defect characterization in an automated fashion. Defects may enter onto semiconductor wafers at each step in the fabrication process. Inline characterization refers to analyzing the wafers as they progress through this fabrication process. Other types of characterization are possible such as analysis that is performed after semiconductor wafer fabrication is complete. When fabrication is complete, the chips on the semiconductor wafer can be electrically tested as well as visually inspected. Visual inspection at completion of fabrication misses certain defects because the defects are covered by other structures on the chip. The cost of detecting defects in a semiconductor chip increases radically as the fabrication process progresses.

By identifying and classifying defects during the fabrication process, certain chips can be determined as failure candidates that deserve no further inspection or testing. There are certain defects which, when present, indicate that the chips are not desirable regardless of the outcome of electrical testing. In some cases certain defects may even be determined to be reliability defects, as opposed to time zero defects, where electrical testing would indicate that a chip is good but which would fail after a short time in the field.

Automated inline defect characterization and classification may be based on the impact of a defect on an electrical circuit using layout analysis and netlist cross-mapping correlation. During semiconductor manufacturing, physical and electrical defects may be detected using high throughput optical or scanning electronic microscope (SEM) based inspection and microscope systems. As design density increases, inline inspection tools are able to detect smaller and smaller defects of interest (DOI) that can effectively cause shorts across critical dimensions (CD) or cause functional failure. A critical dimension is defined as the distance between one electrically active path and another electrically active path. Thus a bridging defect with a size equal to or greater than the critical dimension that causes a short is clearly undesirable. As critical dimensions become smaller, the number of inline defects of concern may increase exponentially. As a result, the number of defects reported may increase dramatically with operators no longer being able to (1) manually review and classify the required number of defects for each inline critical process step, (2) properly classify what is very difficult to see and thus correctly classify, (3) inspect those areas of the device that are most critical and filter out the remaining areas and defects, and (4) inspect those defects that can functionally effect the device. Concepts are disclosed for continuous process quality and yield impact estimation.

The presented method comprises automated defect classification using a design database which includes either the physical representation or layout of an integrated circuit (IC) and the corresponding electrical netlist. In some cases the electrical representation may be in the form of a standard netlist such as Verilog™, VHDL™, transistor level netlist, or the like. In some cases the electrical representation may be of the form of schematics. Whenever a netlist is mentioned in this disclosure it should be understood that other forms of electrical representation are equally possible. In some embodiments, both netlists and schematics may be used together. By correlating the defect of interest to the layout and netlist, defects can be classified and unimportant defects can be filtered out based upon the impact of the defect to the integrity of the electrical circuit. This practice can both dramatically reduce the number of defects required to be considered for inspection and rank defects based upon their impact to the functional integrity of the device. This type process can both increase production output and increase yield enhancement programs dramatically, particularly for technology nodes at and below 45 nanometers.

Once a defect is identified its wafer coordinates may be converted into a corresponding layout position. A rectangular area around this position may be defined by taking into account the reported defect size and an uncertainty regarding the exact defect location due to various challenges including inspection tool inaccuracy. An algorithm which finds the different signals analyzes the area defined within the rectangular area. The various geometric shapes and layout polygons are analyzed. A cross-mapping algorithm is applied to each signal and the corresponding netlists associated with each defect can be calculated.

A netlist may be represented using a chain of strings from which the exact design hierarchy and cell instantiations can be retrieved. Each node in the circuitry may be represented within a netlist from which the parent cells can be recursively extracted. As a result, defects can be binned together which are associated with some common cell within the hierarchy.

Typically, an integrated circuit is designed by placing and reusing standard and custom library cells arranged using a hierarchical composition. In a typical situation, standard cells have been intensively qualified with fabricator yield and manufacturing data being recorded, while custom cells present much more uncertainty regarding their manufacturability and printability. The disclosed methods allow filtering of defects located on both standard cells and custom cells. The methods can be easily integrated into a general sampling strategy for defect selection and efficient process monitoring.

Cell sensitivity to process variation can be calculated using transistor level modeling and Monte Carlo analysis.

The transistor level modeling may be performed using Spice™ or a Spice-like simulator. During the manufacturing process defects could be filtered out which are located on those cells for which process variation sensitivity analysis has already been performed. Filtering out both inline defects and layout regions not required for analysis can rapidly decrease time to yield and reduce overall device manufacturing costs. Expensive inline inspection tools can, in this manner, be more efficiently used and thus reduce the cost of ownership of the tool.

During a lithography qualification process, printing errors may be analyzed and defects associated with similar geometries may be binned together. This process may be referred to as design based binning. The method separates systematic defects from random defects with the same probability occurring at any given location. Systematic defects may include those defects found with high frequency near some similar layout arrangement. These methods can be used to perform inline defect classification. Validating a defect impact on an electrical circuit enables a more accurate way to determine the defect's true functional effect on a device. The disclosed method further enables the ranking and the quantification of different defects based on electrical impact to circuitry, percentage of standard or custom cells with defects, and breakdown of systematic defects on a per cell basis.

Further Details

FIG. 1 is a flow diagram for defect characterization. A flow 100 is described for a computer-implemented method for performing defect characterization. The flow 100 begins with importing a layout 110 for a semiconductor circuit. The layout may be in the form of GDSII or OASIS™ or some other format for describing various shapes, sizes, and relationships among elements in a semiconductor layout. The layout may be for a semiconductor chip or die. The layout may be imported into a database to be included with other information about the chip. All chip layers may be imported, a subset of the chip layers, or only a single layer. In some embodiments, the layout may already reside within a software tool and importing may be construed as using a layout already present in the tool. The flow 100 includes importing a netlist 112 for the semiconductor circuit. The netlist may be in Verilog™, VHDL™, transistor level netlist, or other hardware description language (HDL). The netlist may be imported into a database to be included with other information about the chip. The entire chip hierarchy may be imported or a subset of the chip circuitry may be imported. In embodiments, a flat netlist is imported. In some embodiments, the netlist may already reside within a software tool and importing may be construed as using a netlist already present in the tool. The flow 100 includes importing a schematic 114 for the semiconductor circuit. The schematic may be a graphical representation of the logical blocks, individual transistors, or other components of a semiconductor chip and interconnections between the blocks, transistors, or components. The schematic may be imported into a database to be included with other information about the chip. The entire chip schematic may be imported or a schematic for a subset of the chip circuitry may be imported. In some embodiments, the schematic may already reside within a software tool and importing may be construed as using a schematic already present in the tool.

The flow 100 continues with obtaining images 120 of a semiconductor chip which comprises the semiconductor circuit during fabrication. The images may be obtained with an optical microscope, a scanning electronic microscope, or some other microscopy system. The images may be captured with a CCD, a video camera, a thermal imager, or other camera type apparatus. The images may emphasize one or more defects using voltage contrast. In some embodiments, the flow may include identifying an intersection 124 of nets based on a failure of electrical operation. A defect at a specific intersection may cause a pair of nets to both have degraded operation, such as a short between the nets. Given the electrical failure, the obtaining of the images may be based on the intersection of the nets which were identified.

The flow 100 may continue with determining a critical dimension 122. A critical dimension may be the distance between two polygons where a defect exceeding the critical dimension would cause a bridge between the two shapes. The critical dimension can be between shapes on a single level. These two polygons may be on the same fabrication level, such as for example second level metal. In some embodiments, a critical dimension may be known to be different from the distance between two polygons because rounding, necking, and other fabrication issues cause shapes to distort from the originally designed shapes. In certain cases a critical dimension for a defect may not be the size required to cause a bridge, but instead only cause some other degradation in a circuit performance such as an increase in capacitance or the like. The flow 100 may include determining a critical volume 122. A critical volume is similar to a critical dimension but may be used to describe a defect size concern between multiple levels. The critical volume can be among shapes on a plurality of levels. There may be a distance of concern between two polygons on two levels where a defect exceeding the critical volume would cause a bridge between the two levels. In some embodiments, a critical volume may be known to be different from the distance between two levels because non-planarity and other fabrication issues cause shapes to distort from the originally designed shapes. In certain cases a critical volume for a defect may not be the size required to cause a bridge, but only to cause some other degradation in a circuit performance such as an increase in capacitance or the like. One example of multiple levels would be the levels of first level metal and second level metal. A defect might form a bridge connection between first level metal and second level metal. Any manufacturing levels could be used in such critical dimension or volume analysis including n-diffusion, p-diffusion, n-well, p-well, polysilicon, contact, metal one, metal two, metal three, metal four, metal five, metal six, via one, via two, via three, via four, via five, as well as numerous others.

The flow 100 continues with detecting a defect 130 in one of the images of the semiconductor chip where the defect is at a location on a portion of the semiconductor chip that is represented by the layout. In embodiments, the detecting the defect is accomplished inline during semiconductor manufacturing. The defect may be a systematic defect or a random defect. Detection of the defect may be accomplished by software inspection of the images which were obtained while looking for an anomaly in the images. A golden set of images may be used where the golden set includes known good images. Alternatively, expected shapes or images may be generated based on the layout for the semiconductor chip, and shapes which do not fit those expected shapes or images might be identified. Further, missing shapes in the images may be identified as a defect.

The flow 100 may include filtering out defects based on size 132, where the defect is smaller than the critical dimension for a defect which could affect a single layer in the manufacturing process. The flow may include filtering out defects smaller than the critical volume. Defects can be present on a semiconductor chip without impacting the operation of the chip. A defect which is smaller than a critical size may reside on the chip without any deleterious effect. Defects larger than a critical size in a specific portion of the chip may short out multiple structures, causing an operational failure. In embodiments, the flow 100 includes providing CAD navigation 134 on the semiconductor chip to the location where the defect was detected. A prober or microscope may be navigated to the defect location for further analysis by the system or by a human operator.

The flow 100 may continue with using an uncertainty value for the location to determine a range of possible defect locations 140. An uncertainty value may be based on inaccuracies in image, image location, defect size, defect focus, defect shape, microscope alignment, chip or wafer alignment, and numerous other factors. One or more uncertainty values may be used to evaluate the defect and its location. The uncertainty value may be used from a two-dimensional perspective, looking for defect impact on structures within one manufacturing layer. Alternatively, the uncertainty value may be used from a three-dimensional perspective to determine a range of possible defect locations and the associated impact among chip structures on differing levels. The flow 100 may include analyzing the possible defect locations for impact 142 to operation of the semiconductor circuit. The impact may include having missing connections, resistive connections, additional capacitance, capacitive coupling among signals, or other degradations.

The flow 100 continues with performing electrical analysis of the netlist with the defect which was detected. The analysis may include electrical simulation of the netlist with the defect 150. The electrical analysis may include Verilog™, VHDL™, or other type of logical simulation. The electrical analysis of the netlist with the defect may be performed using transistor level simulation such as Spice™ or a similar tool. The transistor level simulation may include Monte Carlo analysis for a range of defect locations, for a range of resistive shorts, or other defect characteristic. The flow 100 may include ranking the defect 152 and a second defect based on their impacts to operation of the semiconductor circuit. Multiple defects may be detected on the images which were obtained. Based on the location and size of the various defects, the impacts could be different. A small defect in a very critical portion of the circuitry could have a much larger impact on operation. Therefore, defects may be ranked from having the largest impact to a much smaller possible impact on operation. In some cases, certain defects may be ranked such that no operational impact is expected because the defects are small or not in an active circuit area on the chip.

The flow 100 may include correlating an impact 154 of the defect on electrical operation of the semiconductor circuit. The correlating may relate to yield analysis, parametric information, fabrication process data, circuit speed, and so on. The presence of a certain defect may be determined to correspond to a reduction in yield, for instance, based on previous experience with certain defects in specific locations. A defect may also correlate to a certain impact on circuit operation. When a semiconductor chip is fabricated with a certain defect, a specific defective circuit operation may be detected. The defective circuit operation may be a defect signature for the defect. In some cases, electrical testing of a completed chip may be performed and a failure detected. Subsequently, failure analysis may be performed to delayer and identify the cause of the failure. Alternatively, defects may be detected inline and the semiconductor chip may go through further fabrication. Electrical test of the fabricated chip may provide information on the operational impact of the defect which was previously detected. Defects which cause a certain failure may be categorized and information stored in a database for future reference. The stored information may include defect signatures. When similar defects are found, anticipated impacts of those similar defects may be determined. Various defects may be detected inline during the fabrication process. These defects may be correlated to impacts previously seen based on failure analysis.

The flow 100 may include classifying the defect 156 which was detected. Classification may include identifying whether a defect is a short, a resistive short, a capacitive link, a reliability defect, a defect that will have no impact, or the like. Classification may include the layer where the defect came from during the fabrication process. Classification may include the material of the defect. Classification may include whether the defect is a systematic or a random defect. Classification may also include custom descriptions codes, the severity level of the defect, and description of the defect. Various other classifications are possible as well.

The flow 100 may include cross-mapping 160 between two of a group comprising the netlist, the schematic, and the layout. A display of semiconductor layout and netlist is possible. The location of a defect may be shown on both the layout and the netlist by highlighting or otherwise indicating the area of a problem. Images, schematics, and other representations may be displayed for the semiconductor. The defect and associated locations and/or impacts may be shown in each of the representations.

The flow 100 may include searching through the layout 162 for similar geometries to the layout of the portion of the semiconductor chip where the defect was detected. A specific geometric pattern for one or more layers may be identified where defects may occur. This geometric pattern may happen in other locations across a semiconductor chip. By searching through the semiconductor layout, specific spots to look for defects may be identified. In this manner, spots of specific concern may be quickly reviewed in various locations on the chip. One or more additional defects may be detected on similar geometries.

The flow 100 may include performing categorical binning of the similar geometries 164. Groups of similar geometries may be identified and categorized. The categorizations may include the level where a defect can occur. Categorizations can include sizes of geometries where the sizes are useful for determining when a specific size defect will impact circuit operation. Various other types of binnings of geometries are possible.

The flow 100 may include storing 170 results of the electrical analysis or an image of the portion of the layout. The storing may also include information on defects found, images obtained, critical dimensions determined, geometries binned, as well as numerous other aspects. The flow 100 may include displaying 172 waveforms from the electrical analysis. The waveforms may be from Verilog™, VHDL™, Spice™, or other type simulation analysis. Various steps in the flow 100 may be changed in order, repeated, omitted, or the like without departing from the disclosed concepts. Various embodiments of the flow 100 may be included in a computer program product embodied in a non-transitory computer readable medium that includes code executable by one or more processors.

Figure 2:
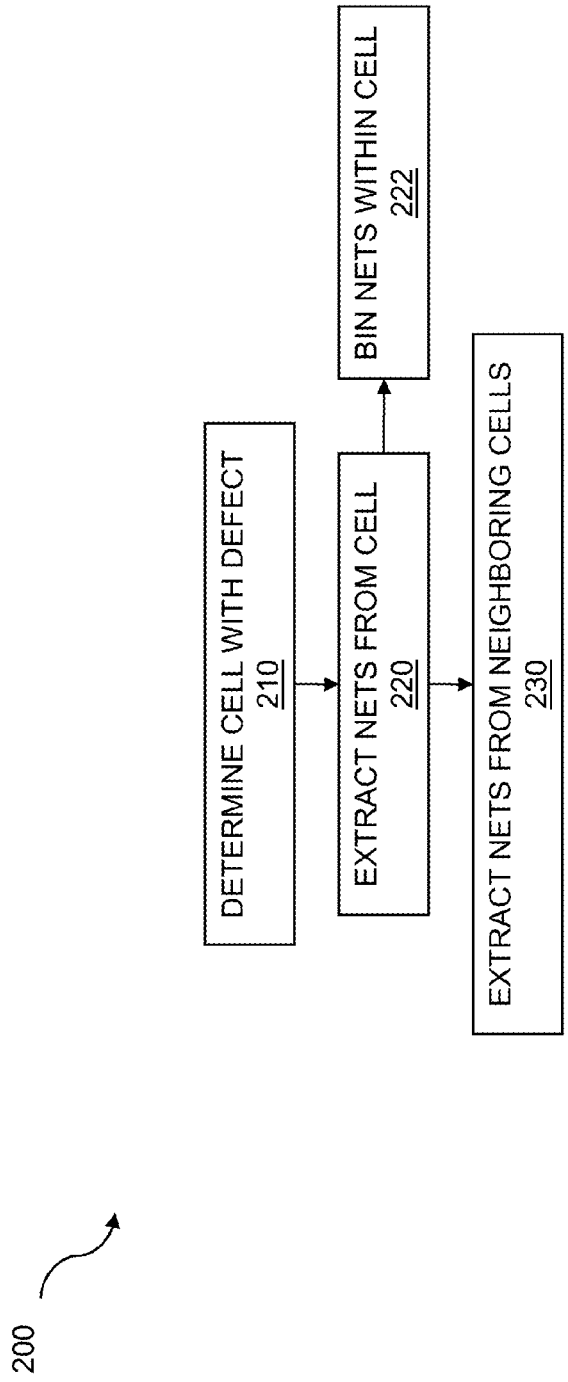
FIG. 2 is a flow diagram for net analysis.

FIG. 2 is a flow diagram for net analysis. A flow 200 is described for a computer-implemented method for performing defect characterization using net analysis. The flow 200 may include determining a cell in the semiconductor circuit in which the defect resides 210. The cell may be a custom cell or a standard cell. Once a defect has been detected 130 the semiconductor layout can be examined and a physical layout cell can be identified in which the defect exists. The flow 200 may continue with extracting nets from the cell 220. Once the cell has been identified, the various nets within the cell can be extracted or identified resulting in a netlist for the cell along with the location for the defect in the netlist. In some embodiments, the netlist can be cross-mapped showing some or all of the layout, images, schematic, and other representations of the circuit and defect. The flow 200 may include binning nets within the cell 222 into a group of nets. Binning may be done based on nets effected by the defect or nets which are in contact with the defect. Binning may be done based on nets which are logically upstream from the defect or logically downstream from the defect. Defect analysis may be done based on geometries that are more susceptible to defects. Various other types of binning are possible. The flow 200 may include extracting nets from neighboring cells 230 such as extracting nets from one or more adjacent cells surrounding the cell. The cells may be physically adjacent to the cell with the defect. The adjacent cells may be at the same level of hierarchy in the netlist as the cell. Alternatively, the adjacent cells may be at a different level of hierarchy in the netlist from the cell. In some cases a defect may span between one cell and its neighbor. When this is the case a defect may cause a short or other defective operation between a net in a first cell and another net in a second, neighboring cell. Therefore extracting nets from multiple cells may be needed in order to perform electrical simulation of the netlist with the defect present. Various steps in the flow 200 may be changed in order, repeated, omitted, or the like without departing from the disclosed concepts. Various embodiments of the flow 200 may be included in a computer program product embodied in a non-transitory computer readable medium that includes code executable by one or more processors.

Figure 3:
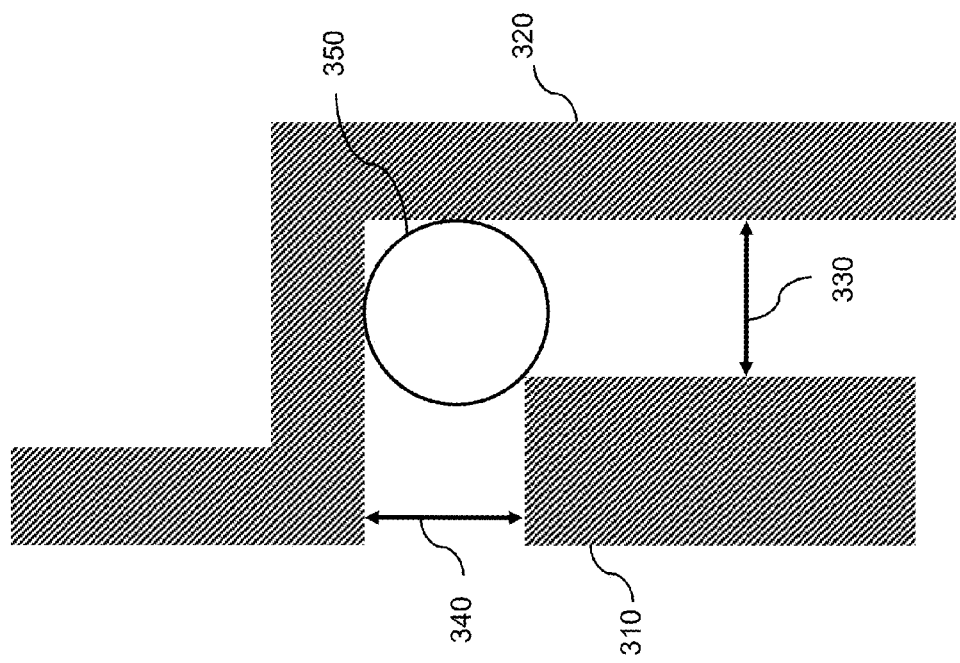
FIG. 3 is a diagram showing example critical dimension analysis.

FIG. 3 is a diagram showing example critical dimension analysis. In this example figure almost any semiconductor structure could be considered including n-diffusion, p-diffusion, n-well, p-well, polysilicon, contact, metal one, metal two, metal three, metal four, metal five, metal six, via one, via two, via three, via four, via five, as well as numerous others. The critical dimension concepts are also equally applicable to determine a critical dimension or critical volume between multiple semiconductor structures including those listed above. In FIG. 3 a first structure 310 is shown adjacent to a second structure 320. The second structure 320 includes a jog. Along the side of the first structure 310 the distance between the first structure 310 and the second structure 320 is an x-dimension distance 330. Any defect larger than the x-dimension distance 330 could cause a bridge between the first structure 310 and the second structure 320.

Along the top of the first structure 310 there is a y-dimension distance 340 between the first structure 310 and the second structure 320. Any defect larger than the y-dimension distance 340 could cause a bridge between the first structure 310 and the second structure 320. When a defect is in the corner of the jog by the second structure 320 around the first structure 310, a defect with a diameter larger than that of a circle 350 could cause a bridge between the first structure 310 and the second structure 320. Depending on the location of the defect, the critical dimension could be the x-dimension distance 330, the y-dimension distance 340, or the circle diameter 350. In some cases a critical dimension may be smaller than one of these dimensions because of uncertainty in a defect size. The critical dimension may occur due to the ability of a resistance to bridge a further distance than just the raw defect size, or other reason.

Figure 4:
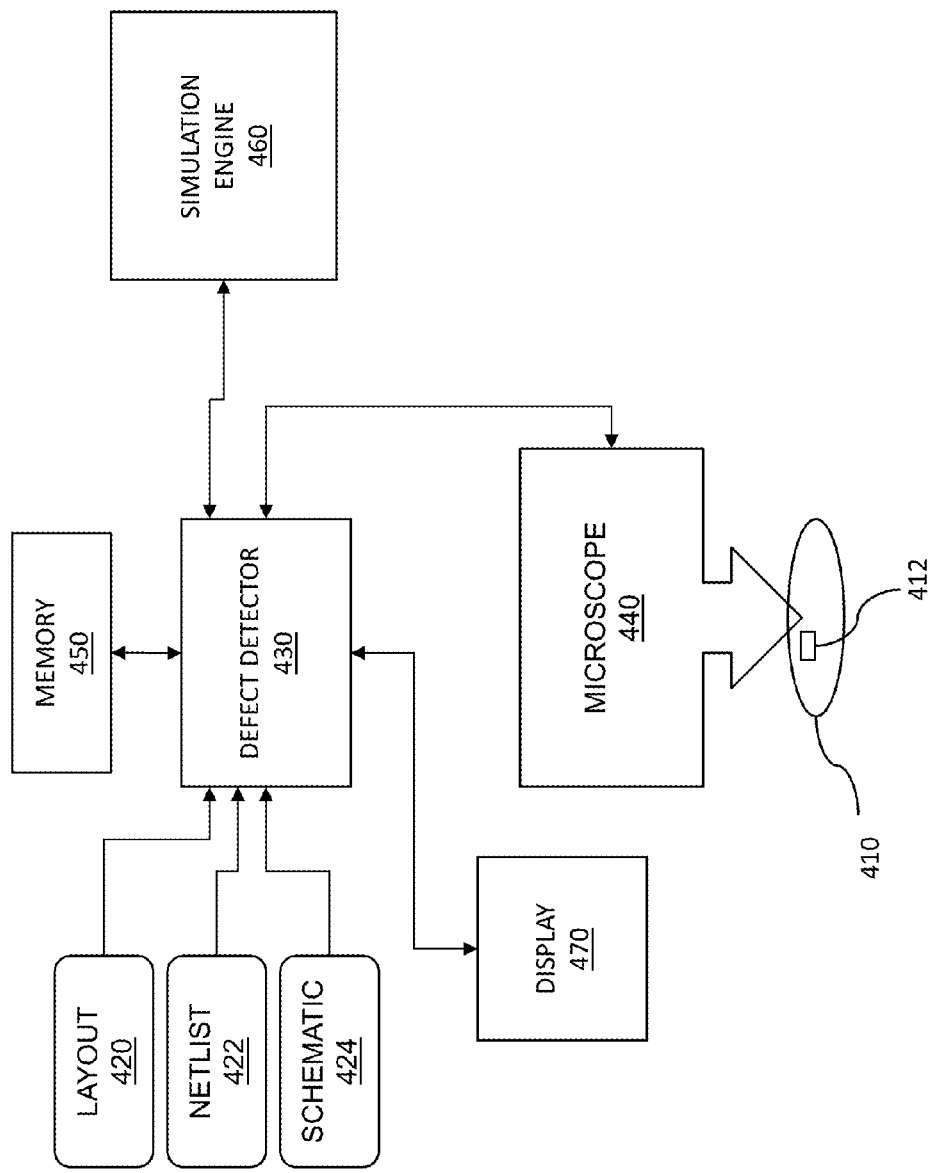
FIG. 4 is a system diagram for defect characterization.

FIG. 4 is a system diagram for defect characterization. A wafer 410 is shown with a semiconductor chip 412. In some cases the semiconductor chip may be a single chip or a portion of a chip mounted for analysis on a slide or a substrate. Various representations of the semiconductor chip may be available to the system including some or all of a layout 420, a netlist 422, a schematic 424, and the like. The layout 420 may be in the form of GDSII or OASIS™ or some other format for describing various shapes, sizes, and relationships of elements in a semiconductor layout. The netlist 422 may be in Verilog™, VHDL™, transistor level netlist, or other hardware description language. The schematic 424 may be a graphical representation of the logical blocks, individual transistors, or other components of a semiconductor chip, and various interconnections among the blocks, transistors, or components. The defect detector 430 to analyze any defects encountered by the microscope 440 uses these various representations. The defect detector 430 may include one or more processors running instructions from the memory 450. The memory 450 may store instructions as well as analysis output, intermediate calculations, images from the microscope, and so on. The prober, which in embodiments may be part of the microscope 440, may be an electrical prober, a contactless prober, an optical microscope, a scanning electron microscope, or other microscope type apparatus. The microscope 440 can capture images for use by the defect detector 430. When a defect is found in an image, the layout 420 can be analyzed to identify which circuits are impacted by the defect. A simulation engine 460 can analyze the netlist 422 given the presence of the defect which was detected. The simulation may be Spice™ or other transistor level simulation, with the defect that was detected being present in the transistor level simulation. The defect may be a short, a resistor, an open, a capacitive linkage, or other type of defect. The simulation may alternatively be a logic level simulation using VHDL™, Verilog™, or some other logical level representation with the defect that was detected being present in the logic. Simulation analysis can include the impact of process variation, changes in clock speed, performance delays, and so on. Results can be shown on a display 470. The display 470 may show images captured by the microscope 440, results of simulation, waveforms from the simulation, the layout 420, the netlist 422, the schematic 424, and other information. The various representations may be cross-mapped to show the defect on two or more of the representations. Instructions for further analysis may be provided to the defect detector 430 or microscope 440 through human input via a keyboard, mouse, or other device. Further, the defect detector 430 may automatically drive further simulation analysis and microscopic image obtaining to further understand and analyze a defect that is detected. Voltage contrast may be used to emphasize the defect. The microscope may be navigated to the location of the defect or to other layout portions with similar geometries. These similar geometry locations can then, in turn, be examined for defects or to obtain further information on defect free circuitry.

Figure 5:
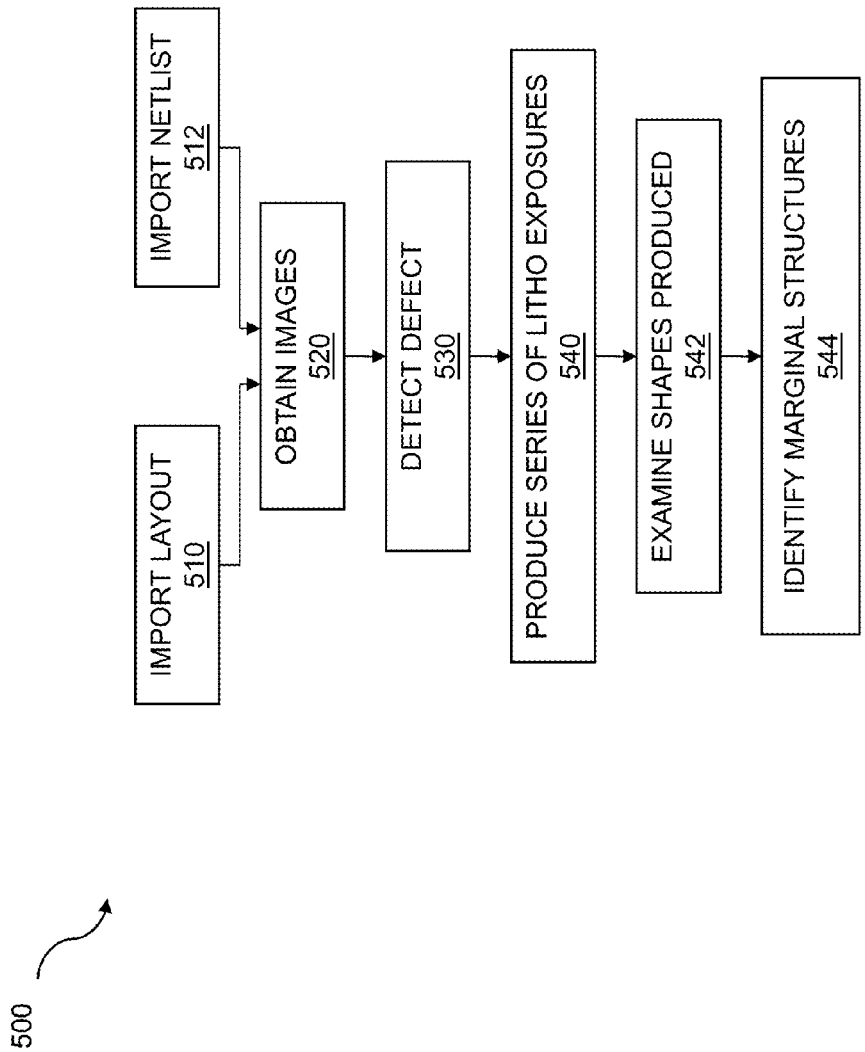
FIG. 5 is a flow diagram for using modulated lithography exposures.

FIG. 5 is a flow diagram for using modulated lithography exposures. A flow 500 is described for a computer-implemented method for using modulated lithography exposures to aid in semiconductor fabrication. The flow 500 may begin with importing a layout 510 for a semiconductor circuit. The layout may be in the form of GDSII or OASIS™ or some other format for describing various shapes, sizes, and relationships of elements in a semiconductor layout. In some embodiments, the layout may already reside within a software tool and importing may be construed as using a layout already present in the tool. The flow 500 includes importing a netlist 512 for the semiconductor circuit. The netlist may be in Verilog™, VHDL™, transistor level netlist, or other hardware description language. In some embodiments, the netlist may already reside within a software tool and importing may be construed as using a netlist already present in the tool. The flow 500 continues with obtaining images 520 of a semiconductor chip which comprises the semiconductor circuit during fabrication. The images may be obtained with an optical microscope, a scanning electronic microscope, or some other microscopy system.

The flow 500 continues with detecting a defect 530 in one of the images of the semiconductor chip wherein the defect is at a location on a portion the semiconductor chip that is represented by the layout. The detecting of the defect may be accomplished inline during semiconductor manufacturing. The defect may be a systematic defect or a random defect. Detection of the defect may be accomplished by software inspection of the images which were obtained by looking for an anomaly in the images.

The flow 500 includes producing a series of modulated lithography exposures 540. This series may provide information on the optimal exposure to use during fabrication. The flow 500 may include examining shapes produced 542 by the series of modulated lithography exposures. The shapes may include necking, rounding, missing shapes, and the like, to evaluate the fabrication process. The flow 500 includes identifying marginal structures 544 where a similar defect to the defect that was detected would impact circuit operation based on the series of modulated lithography exposures. In geometries which are similar to those where the defect was detected, weaknesses may be identified and the lithography exposure may be tweaked to avoid future fabrication problems. Various steps in the flow 500 may be changed in order, repeated, omitted, or the like without departing from the disclosed concepts. Various embodiments of the flow 500 may be included in a computer program product embodied in a non-transitory computer readable medium that includes code executable by one or more processors.

Figure 6:
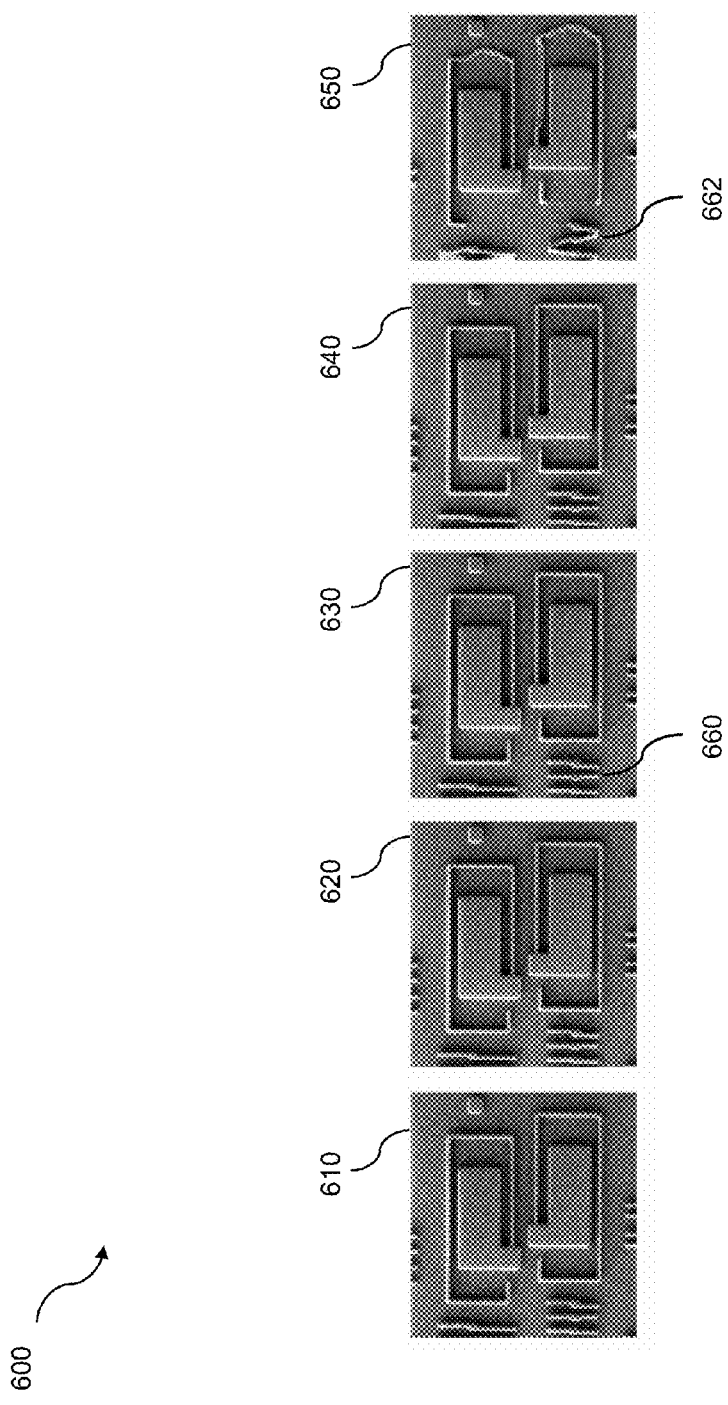
FIG. 6 is a diagram showing example modulated lithography exposures.

FIG. 6 is a diagram showing example modulated lithography exposures 600. A first FIG. 610, a second FIG. 620, a third FIG. 630, a fourth FIG. 640, and a fifth FIG. 650 are shown for various lithography exposures for a portion of a semiconductor chip where the images were obtained with a scanning electron microscope. In these example lithography exposure images, the shapes can be seen to modify with lithography exposure. For instance, a first set of shapes 660 in the third FIG. 630 can be seen to be distinct. For another lithography exposure, the second set of shapes 662 in the fifth FIG. 650 can be seen to run together and no longer be distinct. Based on these variations in lithography exposure and the resulting shapes, a good lithography exposure setting can be chosen for the fabrication process of this semiconductor chip portion.

Figure 7:
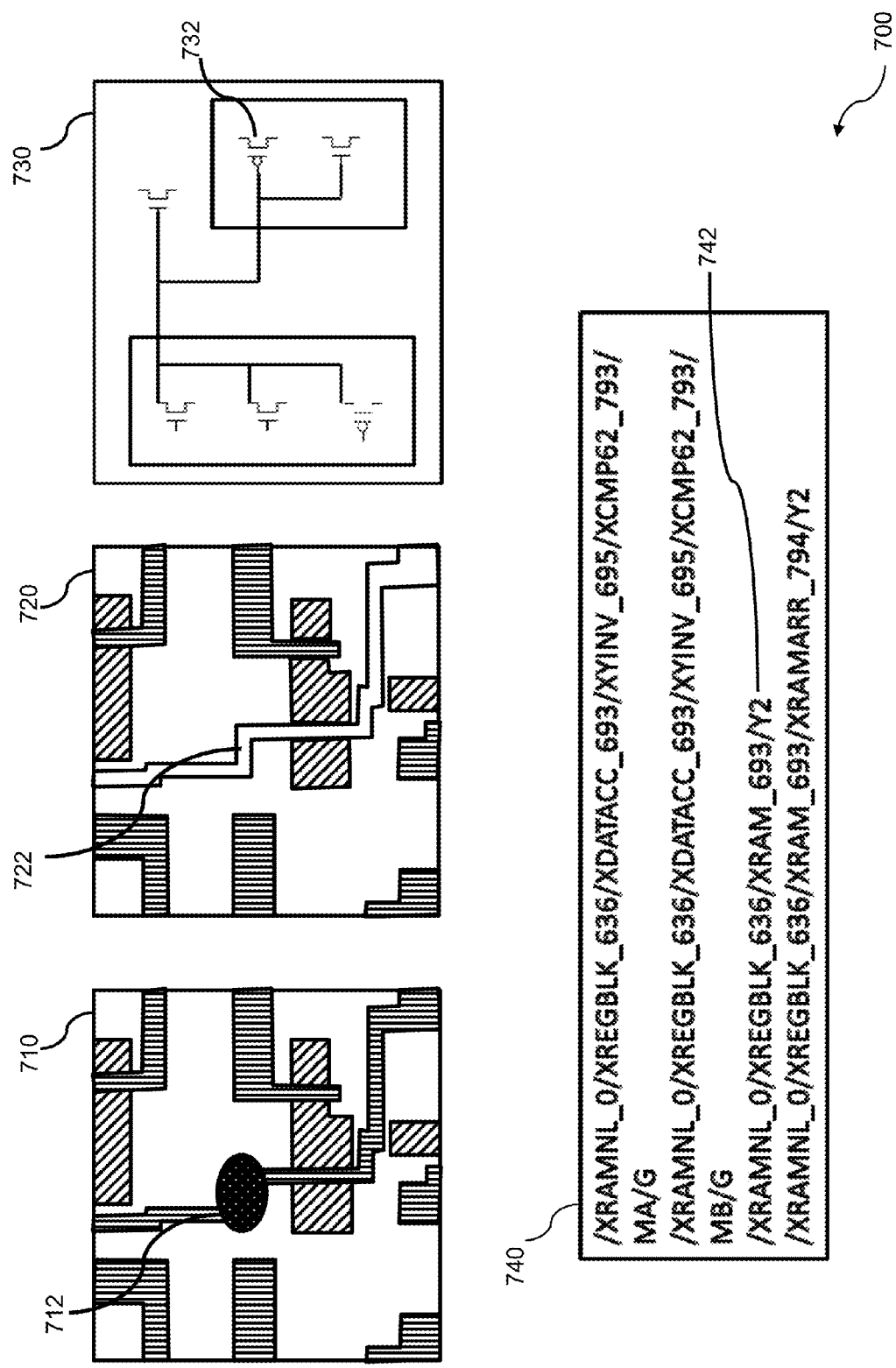
FIG. 7 is a diagram showing an example layout, schematic, and netlist.

FIG. 7 is a diagram showing an example layout, schematic, and netlist. A group of representations 700 are shown that can be used to analyze a defect and its impact on the circuitry of a semiconductor chip. A first layout image 710 is shown with a location 712 of a defect that was detected. A second layout image 720 is shown without the defect location present and the normal polygon shapes 722 included. A schematic image 730 is shown. A location for the defect 732 is included. A netlist image 740 is shown. A location for the defect 742 is included. Two or more of the various representations may be cross-mapped so that the defect location can be highlighted. In some embodiments, other representations may be shown with further detail about the defect and its impact.

Various techniques associated with performing semiconductor failure analysis using design rule checks (DRCs) are described. Failure analysis can include evaluation of failing semiconductor devices to determine root cause of failure through examination of the structures and defects on a physical device. Design rule checking can include evaluating semiconductor layout structures for specific patterns where the patterns and key dimensions are defined as rules. Users may create rules to search for specific geometric relationships within semiconductor layout shapes based on electrical signals and possible defect locations. Rules may describe one or more of sizing constraints and spacing constraints. Rules may describe shape-oriented operations.

A variety of systematic defects are possible, including for example, a systematic defect resulting due to polygon design within a layout or due to fabrication where adjacent shapes are regularly produced in an incorrect fashion. A systematic defect also may be produced by process and design interactions. In practice, systematic defects can be subtle and tracking them down can require careful testing. It is therefore desirable to be able to identify systematic defects during failure analysis. In some cases, a systematic defect may only be detectable with a certain arrangement of shapes, such as a group of polygons (or constellation) in the layout. Furthermore, certain arrangements of polygons may be more susceptible to defects and require careful failure analysis based on the layout using.

Traditional design rule checking performs design verification using "pre-silicon" shapes. The pre-silicon shapes are design shapes that may or may not reflect the ultimate fabricated shapes. The fabricated shapes can have foreshortening, rounding, and other modifications that are a function of light waves and the limits of physics and chemistry at the small dimensions on the semiconductor chip. Failure analysis techniques can be used that analyze semiconductor layouts using DRCs. An example design rule check (DRC) for one type of systematic defect can include evaluating two adjacent tracks to ensure that they are not closer than a certain specified distance value. In embodiments, a design rule may be created to identify a certain arrangement of polygons and then checked against the remainder of the semiconductor layout to identify other defect sensitive sites. The design rule may be used to describe a potential defect that is systematic. It will be appreciated that a wide variety of design rules can be created.

Figure 8:
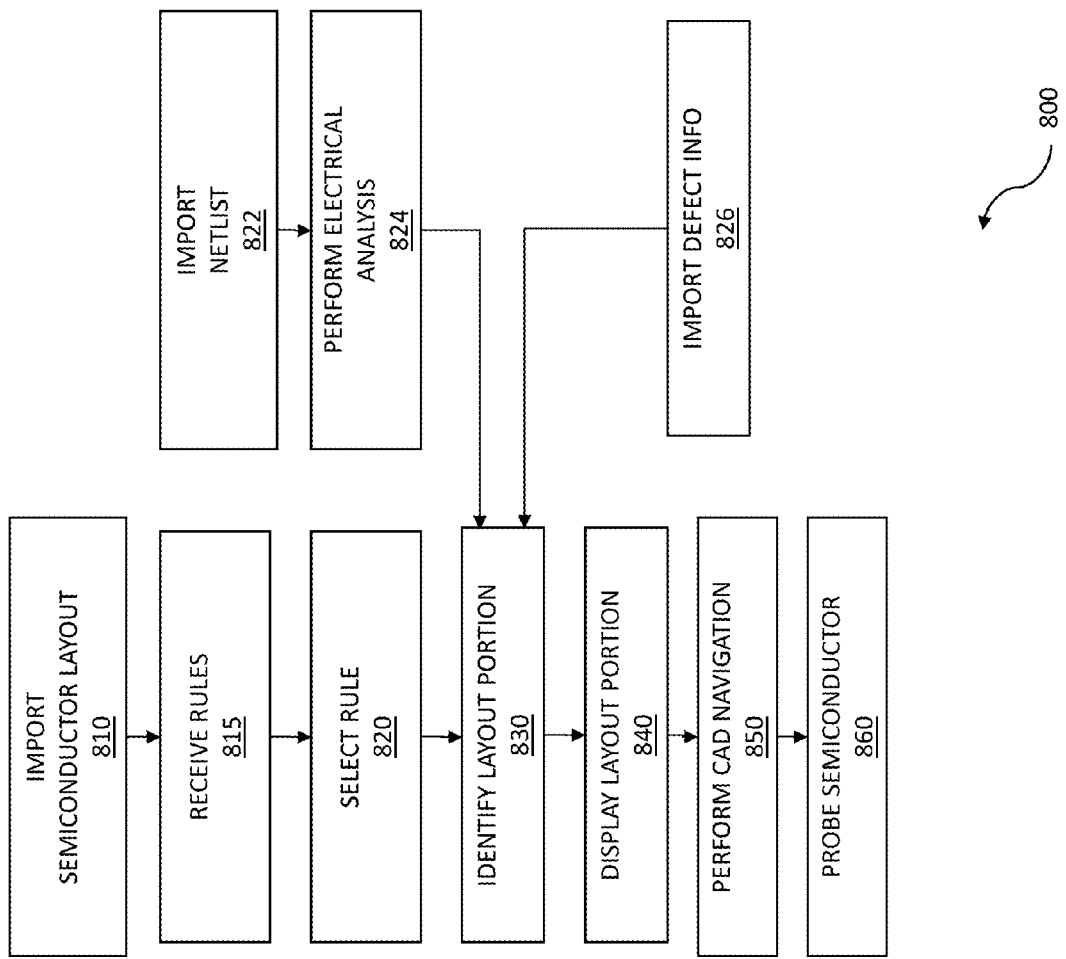
FIG. 8 is a flow diagram for performing semiconductor failure analysis using design rule checks.

FIG. 8 is a flow diagram for performing semiconductor failure analysis using design rule checks. A failure analysis process 800 begins with importing the semiconductor layout 810. The layout may be in the form of GDSII™ or Oasis™ or some other format for describing various shapes, sizes, and relationships of elements in a semiconductor layout. The layout may be for a semiconductor chip or die. The layout may be imported into a database to be included with other information about the chip.

Rules are received 815, the rules describing design rule checks for manufacturing technology in which a chip is to be fabricated. The rules may include rules describing a design rule check for the layout. In some embodiments, a foundry by which the chip is to be fabricated may provide the rules. In some embodiments, the rules may be generated as part of the failure analysis process 800. The rules may describe widths of certain structures on chip, spacings between structures, overlap between one shape and another shape, or any other checks that may help in verifying the layout.

One or more of the rules are selected 820. This may include selecting a rule to apply to the layout. The rule may be selected in an automated fashion or may be specifically chosen by a user to perform a specific failure analysis. In some embodiments, a rule may be recommended by a foundry as pertinent to failure analysis due to, for example, recent fabrication experience, returns from the field where a number of failures were encountered, and so on.

A netlist may be imported 822. The netlist may correspond to the layout. The netlist may describe electrical components that make up the chip. The components may include inverter, AND, OR, NAND, NOR, XOR, XNOR, MUX, SEL, and other types of logical gates. The components may include multipliers, adders, ALUs, processors, cores, and other portions of logic. The netlist may include a description of interconnections among the various components as well as individual transistors. The netlist may further include information on the components including size, delay, power, and other characteristics.

An electrical analysis may be performed on the netlist 824. The electrical analysis may include determining electrical connectivity, delay, power, timings, or other aspects related to the operation of the semiconductor chip. In embodiments, electrical analysis may include analyzing the relationship of electrical signals to each other or to surrounding passive structures. The analysis may allow failure analysis personnel to access the layout and search within an area of interest for special geometric relationships between shapes on various layers. The failure analysis process 800 may include online searches of a layout database for geometric features defined by a set of rules. The impact of defects from a manufacturing process on electrical signals may be analyzed along with the impact on semiconductor chip operation. In some embodiments, importing the netlist 822 or performing electrical analysis 824 can be omitted without diverging from the scope of this disclosure. It will be appreciated that the process 800 may include storing the results of the electrical analysis, displaying waveforms from the electrical analysis, and so on.

Searching through the semiconductor layout for a match to the rule that was selected identifies a portion 830 of the layout. The portion of the layout may be identified based on the layout itself along with the rule that was selected. In some embodiments, the portion of the layout is identified based on the layout, the electrical analysis, the rule that was selected, and so on. The portion of the layout may be identified by searching through the whole layout for a match to the DRC corresponding to the rule that was selected. In some embodiments, a section of the layout is used as a starting point for searching for a match to the rule that was selected. The section may be chosen based on a history of failures or some other focused concern. There may be failures in a specific group of components or portion of a semiconductor chip where a selected rule may be applied against that section of the layout. The identifying may be accomplished by progressively searching through the semiconductor layout to find a match between the rule and a subset of the semiconductor layout. The subset may include the entire chip or any portion of the chip.

The design rule checking may describe a two-dimensional Boolean operation on shapes of a layer. Two-dimensional Boolean checking may be a combination of two or more rules to filter out and find a desired shape, area, or polygon in the layout. Two-dimensional Boolean checking may allow for creating complex search criteria based on different parameters. For example, two-dimensional Boolean checking may allow for finding a particular polygon or pattern by using two rules. One rule may be for filtering polygons that meet a certain width criteria. A second rule may check for overlap to narrow the search results to the desired criteria.

A search may alternatively be based on two-dimensional Boolean operations on shapes on differing layers. A search may be based on two-dimensional Boolean operations on shapes on one or more layers and based on the shapes of certain electrical signal wires. A search may be based on two-dimensional Boolean operations on shapes on one or more layers and based on defect shapes derived from defect scanning tools. Defect shapes may also be derived from yield management systems. Searching may be based on size or spacing constraints. Searching may be based on shape-oriented operations.

A two-dimensional Boolean operation may include accomplishing two rule checks as part of a search. For example, two rule checks might include a check for a metal width and a check for a metal extension beyond a via. For another example, two rule checks might include a polysilicon width and an extension of the polysilicon shape past the end of a diffusion.

A rule may describe a two-dimensional Boolean operation on shapes of a plurality of layers. A rule may describe a two-dimensional Boolean operation on shapes of one or more layers as well as neighboring electrical traces identified from the electrical analysis of the netlist. A rule may describe a two-dimensional Boolean operation on shapes of one or more layers as well as shapes of waveforms resulting from the electrical analysis. A rule may describe a two-dimensional Boolean operation on shapes of one or more layers and shapes of potential defects derived from one of defect scanning tools and yield management systems.

Defect information may be imported from a semiconductor fabrication process 826. The defect information may include the size, the type, the level in the fabrication process at which a defect appears, and other aspects about the defect. The defect information may be obtained from the foundry, a third party analyst, or the like. Further, the defect information may be based on experience with previous technologies and so on. In some embodiments a portion of the layout may be identified based on a rule that is selected 820 and based on the defect information that was imported 826.

A portion of the semiconductor layout may be displayed 840. It will be appreciated that a variety of graphical user interface techniques (e.g., highlighting, color emphasis, zoom, etc.) can be applied to the portion of the layout as displayed. It will be further appreciated that the any and all of the portion of the layout as displayed can be stored to a computer-readable medium.

Computer Aided Design (CAD) navigation to the portion of the layout as displayed may be provided 850. The CAD navigation may involve movement of a wafer or a test head so that analysis is done at a desired location on the semiconductor device. The CAD navigation may be used with a piece of test equipment where a wafer or chip is moved to a location where the layout that was identified is observed under a microscope.

The semiconductor chip may be probed 860, for example, by moving a probing location on a chip to the portion of the semiconductor layout. Based on the layout portion which was identified a possible defect site may be determined. A tester may use CAD navigation to move the tester to the portion of the layout that was identified. The portion of the layout may be probed by electrical probing with metal connectors, electron beam probing, laser probing, or other type of probing. Various steps in the flow 800 may be changed in order, repeated, omitted, or the like without departing from the disclosed concepts. Various embodiments of the flow 800 may be included in a computer program product embodied in a non-transitory computer readable medium that includes code executable by one or more processors.

Figure 9:
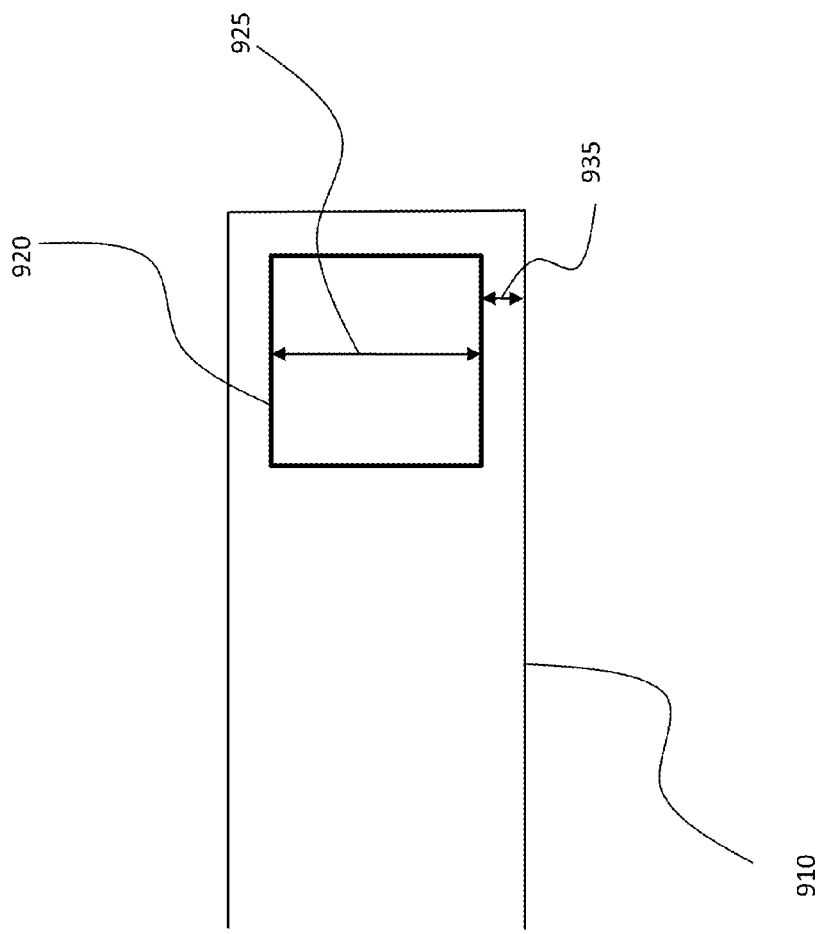
FIG. 9 is an example diagram of a layout portion on which design rule checks can be performed.

FIG. 9 is an example diagram of a layout portion on which design rule checks can be performed. In this exemplary diagram metal line 910 has a via 920 which provides electrical connection to the next layer of metal line. The via 920 may be required to have a width 925 and be verified by a DRC. An example via width is 100 nm. The metal line 910 may be required to have an extension 935 of a specified value and may be verified by a DRC. An example extension is 10 nm. Numerous other types of DRCs exist including diffusion-to-diffusion spacings, contact areas, minimum metal-to-metal spacings, dog-bone end sizing requirements on polysilicon shapes, via adjacency requirements, and so forth. Numerous DRCs can be used to aid failure analysis.

Figure 10:
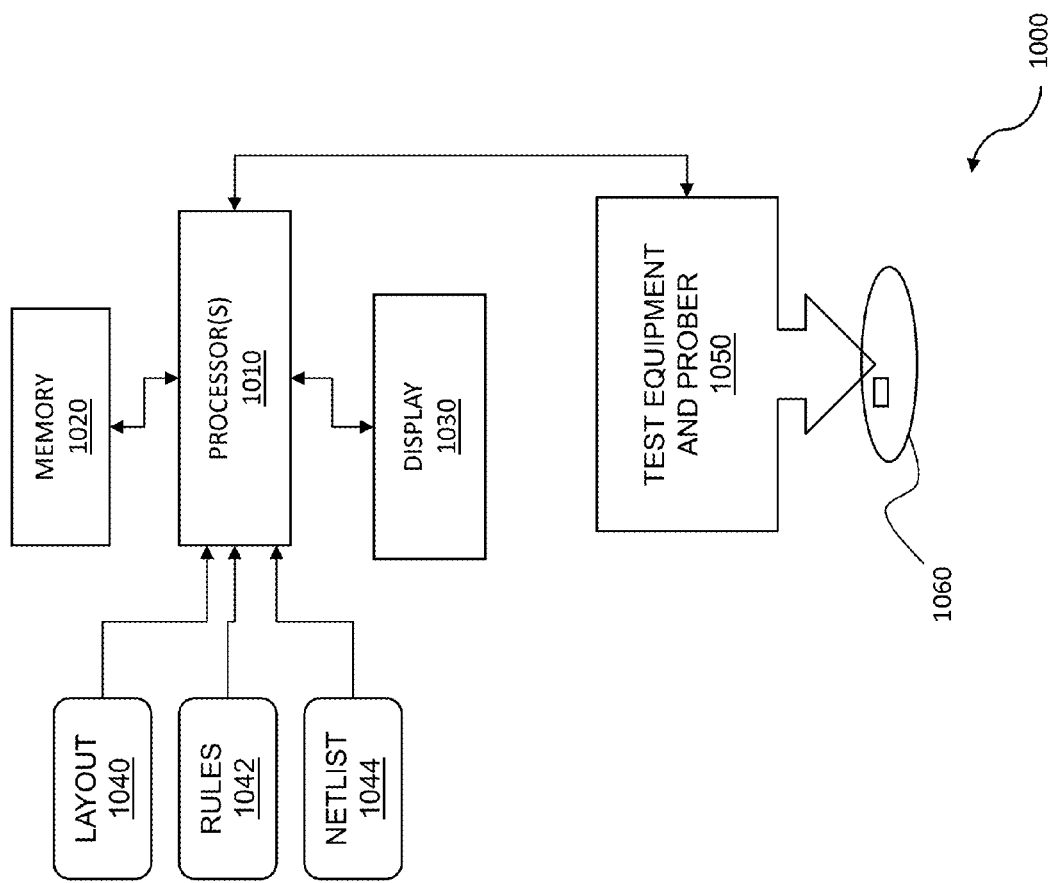
FIG. 10 is a diagram of a system for performing semiconductor failure analysis using design rule checks.

FIG. 10 is a diagram of a system 1000 for performing semiconductor failure analysis using design rule checks. One or more processors 1010 may communicate with memory 1020. The memory 1020 stores data on the layout, rules, netlist, and other aspects of the semiconductor. The memory 1020 stores instructions for performing the failure analysis, for displaying information on defects, for operating tester equipment, and so on. The processor 1010 can render information on a display 1030. The display can be used to show the layout and images of the semiconductor chip along with defect information and other information for performing failure analysis.

The processor 1010 reads in layout information 1040 about the semiconductor chip. The layout information 1040 may include design dimensions and associated shapes. The layout information 1040 can include modified shapes to aid in fabrication such as optical proximity correction (OPC) shapes. The layout information 1040 can include information on post-fabrication shapes. Other layout information will be appreciated for various purposes.

The processor 1010 can read in rules 1042 such as design rule checks used to aid in failure analysis. The rules 1042 can be used to identify regions of layout that may be of concern for random defects or for systematic defects. The processor 1010 may analyze the layout 1040 in light of the rules 1042 to identify layout portions for further failure analysis.

In embodiments, the processor 1010 reads in netlist information 1044 about the semiconductor chip. The netlist 1044 can be used with the layout 1040 along with the rules 1042 to identify portions of the chip for failure analysis.

The processor interacts with the test equipment and prober 1050. The test equipment 1050 includes an optical or scanning electron microscope, a wafer or chip stage, electrical stimulus and power supply capability, and electrical or contactless probing apparatus. The test equipment 1050 moves over wafer 1060 via CAD navigation. The test equipment 1050 can then probe the wafer 1060 or a chip at the correct point to perform failure analysis and to identify a defect.

Figure 11:
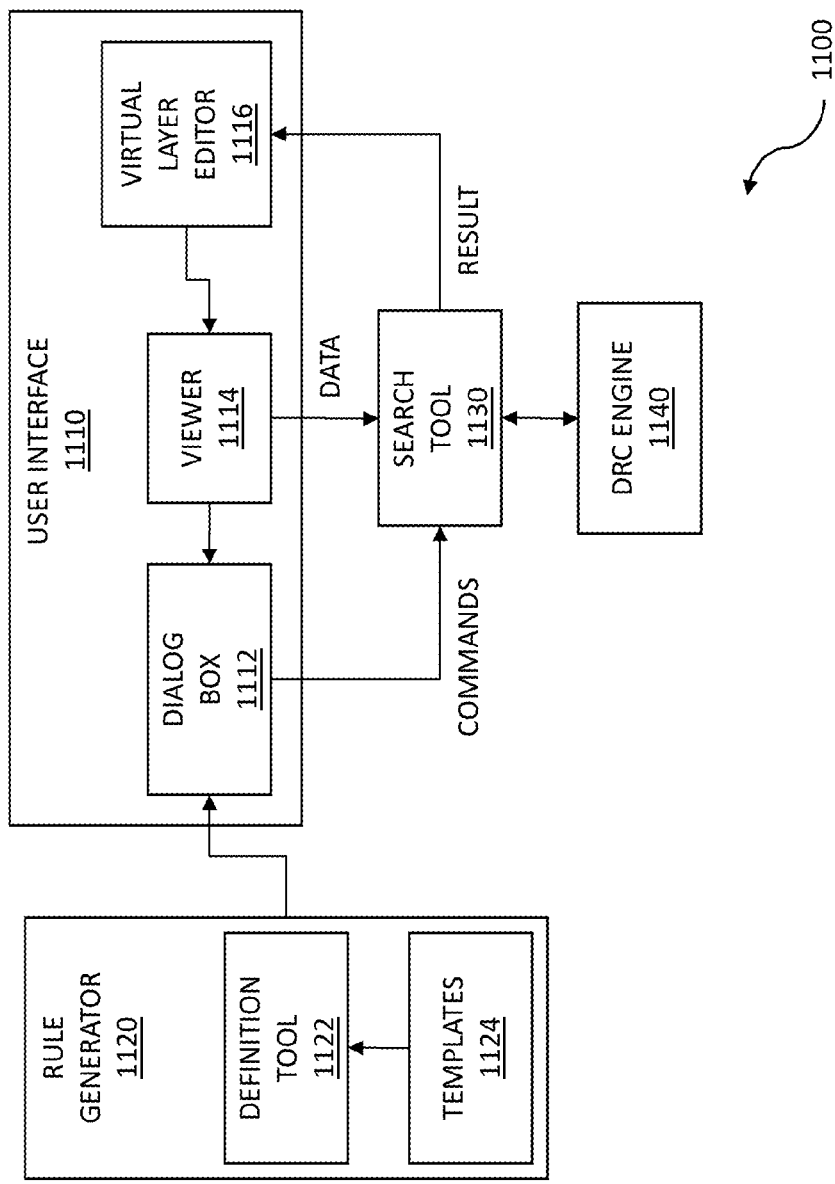
FIG. 11 is a diagram of a failure analysis system with a design rule check engine.

FIG. 11 is a diagram of a failure analysis system with a design rule check engine. The failure analysis system 1100 includes a user interface 1110, a rule generator 1120, a search tool 1130, and a DRC engine 1140. Within the rule generator 1120, templates 1124 reside which can be used to define rules that are desired by a user during failure analysis.

The rule generator 1120 may use one or more templates 1124 in a definition tool 1122. The definition tool 1122 can provide rules to the user interface 1110. A template can filter and identify certain layers or certain dimensions of concern. In embodiments, rules are generated during the failure analysis processes that match certain templates. A set of rules can be created as part of the semiconductor failure analysis. In some embodiments, the rules may be imported or may be provided by a foundry, an analysis party, or some other third party.

The user interface 1110 may include a dialog box 1112, a viewer 1114, and a virtual layer editor 1116. A dialog box 1112 may allow reading in of various rules. The dialog box 1112 may also prompt the user to provide information and create rules for failure analysis using the rule generator 1120. The dialog box 1112 may be used to select one or more rules for use in analysis of a layout. The dialog box 1112 may capture commands that are fed to the search tool 1130.

The search tool 1130 allows for searching across a semiconductor layout using one or more rules. The search tool 1130 uses a DRC engine 1140 to exercise the rules that were selected in the dialog box 1112 to search through the layout. The search tool 1130 finds matches in the layout with the selected rules.

A virtual layer editor 1116 captures the portion of the layout that was identified by the search tool 1130. The virtual layer editor 1116 can be used to exchange information about features in the layout. In embodiments, the virtual layer editor 1116 adds layers to the layout. These added layers do not reflect any physical design shapes but are instead virtual layers that can help identify areas of concern to designers and failure analysis engineers. The virtual layers can be used to draw geometric shapes, add text, or incorporate lines to annotate the layout. Among other items that may be incorporated are locations for focused ion beam modifications such as probe points, added signal wires, or metallization removal areas. The layout portion where the virtual layers are added can be displayed through the viewer 1114. Data from the viewer 1114 may be fed back to the search tool 1130 to refine the search. The viewer 1114 provides location and other information into the dialog box 1112. The dialog box 1112 can capture instructions to modify the search parameters or move locations on the semiconductor device for further searching by the search tool 1130.

Figure 12:
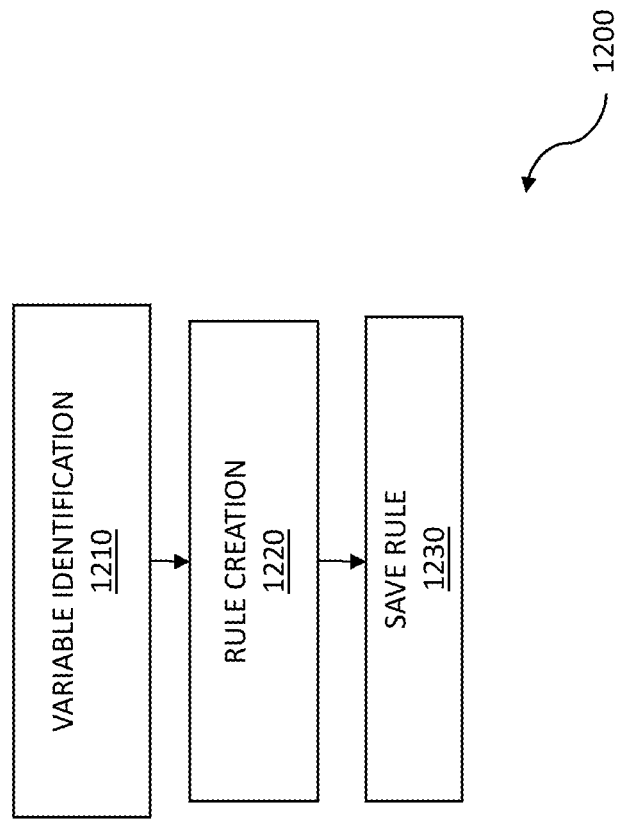
FIG. 12 is a flow diagram for design rule check creation.

FIG. 12 is a flow diagram for design rule check creation. The process 1200 begins with identifying one or more variables 1210. The variables relate to the layers for which the rule is being created. The variables can include information on widths, spacings, shapes, and other aspects of a possible rule.

The flow 1200 includes having a rule created 1220. The rule can include a specific dimension for a width of a shape. The rule can include a dimension for a space between shapes. The shapes may be on the same or different levels. A rule may identify one or more layers. In embodiments, a rule identifies layout shapes for which to search. In some embodiments, rules identify certain electrical structures and their associated layout shapes for which to search. The rules can be been imported or be created by the failure analysis software. In embodiments, the rules are obtained from a foundry, from a fabrication analysis team, or from experience based on previous failure analysis and manufacturing defects. The rule can be saved 1230 for future use or documentation purposes. Various steps in the flow 1200 may be changed in order, repeated, omitted, or the like without departing from the disclosed concepts. Various embodiments of the flow 1200 may be included in a computer program product embodied in a non-transitory computer readable medium that includes code executable by one or more processors.

Figure 13:
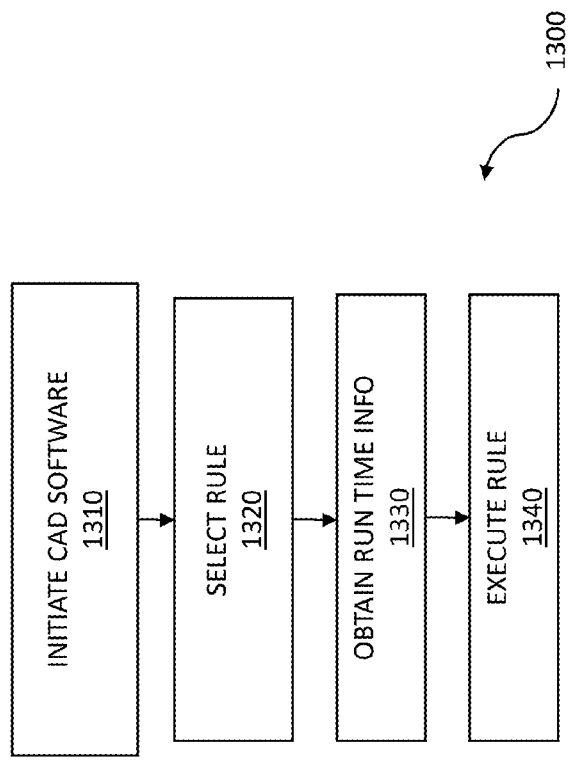
FIG. 13 is a flow diagram for design rule check execution.

FIG. 13 is a flow diagram for design rule check execution. The process 1300 begins with initiation of the CAD software 1310. This software may be used for CAD purposes, for failure analysis purposes, or be part of some larger electronic design automation (EDA) package. Initiating the software may include opening or loading the semiconductor layout.

The flow 1300 includes where a rule is selected 1320. The rule may identify one or more layers. The rule may identify layout shapes for which to search. In addition, the rule can identify certain electrical structures and their associated layout shapes to search. The rule may have been imported or may have been created by the failure analysis software. The rule may have been obtained from a foundry, from a fabrication analysis team, or from experience based on previous failure analysis and manufacturing defects.

The flow 1300 includes where run time information is obtained 1330. The run time information can include instructions on the specific processors on which to execute. The rule can be executed against the semiconductor layout 1340. The rule may be used to search for a portion of the layout that matches the rule. This portion of the layout may be displayed on a layout editor or viewing tool. Various steps in the flow 1300 may be changed in order, repeated, omitted, or the like without departing from the disclosed concepts. Various embodiments of the flow 1300 may be included in a computer program product embodied in a non-transitory computer readable medium that includes code executable by one or more processors.

Figure 14:
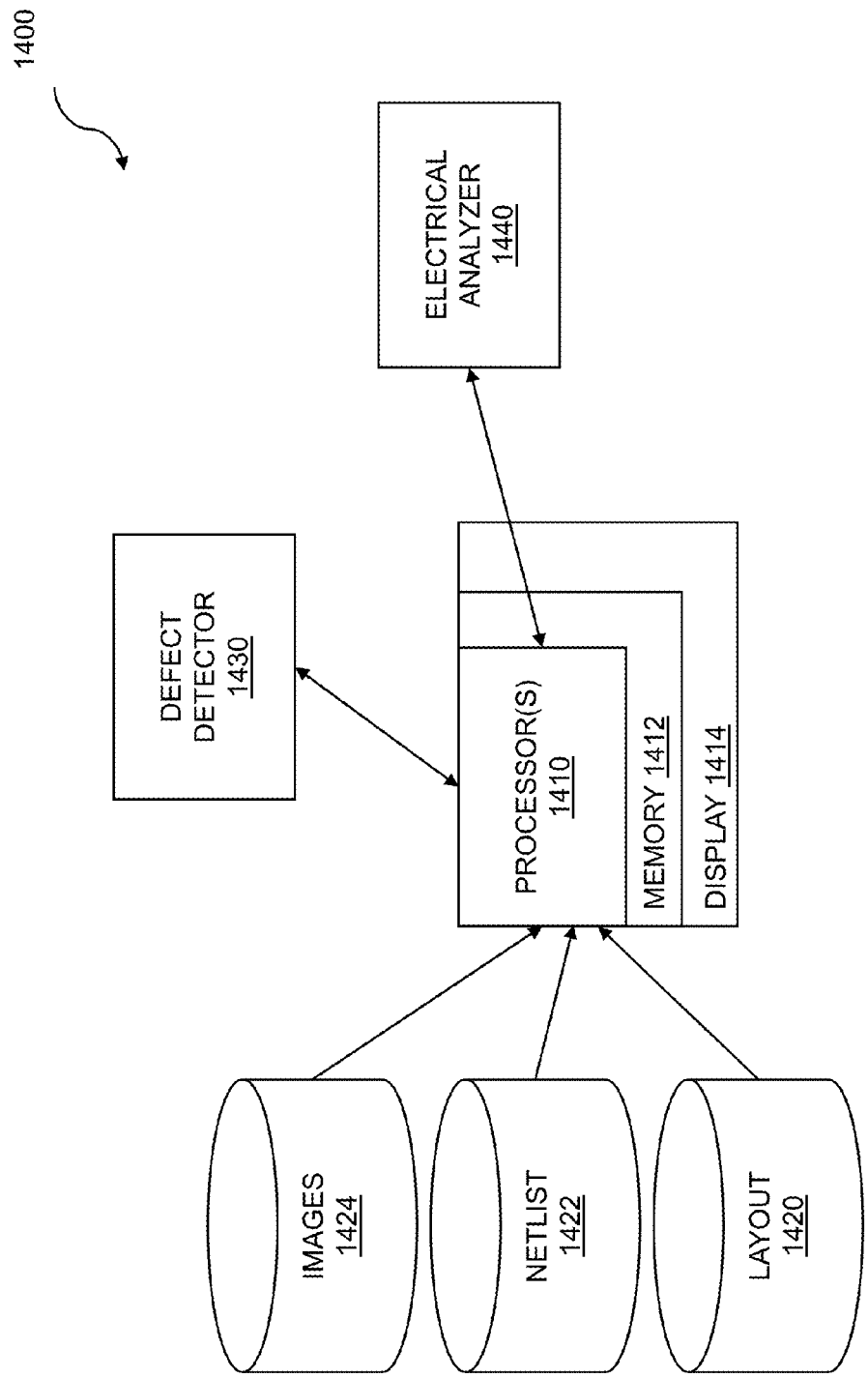
FIG. 14 is a system diagram for performing defect detection and analysis.

FIG. 14 is a system diagram for performing defect detection and analysis. The system 1400 may include one or more processors 1410 and a memory 1412 which stores instructions. The memory 1412 is coupled to the one or more processors 1410 wherein the one or more processors 1410 can execute instructions stored in the memory 1412. The memory 1412 may be used for storing instructions, for storing circuit designs, for storing logic designs, for storing images, for system support, and the like. The one or more processors 1410 may import a layout 1420 for a given semiconductor wafer, kerf, chip, or other device. The one or more processors 1410 can import a netlist 1422 corresponding to the layout or a portion thereof. Obtaining or importing can include importing a design and supporting information or it can involve having the design and information already within a software tool. The obtaining can be part of an electronic design automation (EDA) process. The netlist may be in the form of a transistor-level description, Verilog™, VHDL™, SystemVerilog™, SystemC™, or other design language. The netlist may describe connections between blocks, gates, or transistors within a semiconductor chip. In some cases the electrical representation may be in the form of a standard netlist such as Verilog™, VHDL™, transistor level netlist, or the like. In some cases the electrical representation may be of the form of schematics. Whenever a netlist is mentioned in this disclosure it should be understood that other forms of electrical representation are equally possible. In some embodiments, both netlists and schematics may be used together. The one or more processors 1410 may obtain images 1424 corresponding to the layout or a portion thereof. The images 1424 may have been stored or may be read in from an imaging device. Some or all of the layout 1420, the netlist 1422, and the images 1424 may be shown on a display 1414 coupled to the one or more processors 1410. The display 1414 may be any electronic display, including but not limited to, a computer display, a laptop screen, a net-book screen, a tablet screen, a cell phone display, a PDA display, a mobile device display, a remote with a display, a television, a projector, or the like.

A defect detector 1430 may analyze the images 1424 to identify or detect defects. The defect detector 1430 may focus on certain portions of the layout 1420 based on a type of electrical failure on the semiconductor device. An electrical analyzer 1440 may simulate the netlist 1422, and thereby perform electrical analysis, with defects which were detected by the defect detector 1430. Information from the electrical analyzer 1440 may be fed to the defect detector 1430 to identify a portion of the layout 1420 on which to focus on for possible defects. In at least some embodiments, the one or more processors 1410 accomplish the defect detector 1430 and/or the electrical analyzer 1440 functions. In embodiments, the system 1400 includes computer program product embodied in a non-transitory computer readable medium comprising: code for importing a layout for a semiconductor circuit; code for importing a netlist for the semiconductor circuit; code for obtaining images of a semiconductor chip which comprises the semiconductor circuit during fabrication; code for detecting a defect in one of the images of the semiconductor chip wherein the defect is at a location on a portion the semiconductor chip that is represented by the layout; and code for performing electrical analysis of the netlist with the defect which was detected.

Each of the above methods may be executed on one or more processors on one or more computer systems. Embodiments include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions can be stored, compiled, or interpreted to run on a computer, a programmable data processing apparatus, a heterogeneous combination of processors or processor architectures, and so on. Without limitation, embodiments of the present invention can take the form of web-based computer software, which includes client/server software, software-as-a-service, peer-to-peer software, or the like.

In embodiments, a computer can enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer can process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A computer implemented method for performing semiconductor failure analysis comprising:
    having a set of rules wherein each rule of the set of rules describes a design rule check for a semiconductor layout;
    selecting a rule from the set of rules to apply to the semiconductor layout wherein the rule describes a two-dimensional Boolean operation on shapes where the rule further describes shapes of one or more layers and shapes of potential defects derived from defect scanning tools or yield managements systems, wherein the Boolean operation on shapes further includes shapes of electrical traces identified from electrical analysis of a netlist representing circuitry in the semiconductor layout;
    identifying a portion of the semiconductor layout by searching through the semiconductor layout for a match to the rule which was selected; and
    displaying the portion of the semiconductor layout.

2. A computer program product embodied in a non-transitory computer readable medium, when executed by a processor, causes the processor to perform defect characterization, the computer program product comprising instructions that when executed cause the processor to:
    inspect images of a semiconductor chip comprising a semiconductor circuit during fabrication to look for an anomaly in the images by comparing the images to known good images, resulting in detecting a defect in the images;
    perform electrical analysis of a netlist, for the semiconductor circuit, with the defect which was detected to perform electrical simulation of the netlist, for the semiconductor circuit with the defect wherein the electrical simulation includes a range of resistive shorts for the defect; and
    rank the defect based on impact to operation of the semiconductor circuit, based on the range of resistive shorts.

3. The computer program product of claim 2 wherein the detecting includes detecting where the defect is larger than a critical dimension in one of the images of the semiconductor chip.

4. The computer program product of claim 3 wherein the detecting is further based on determining a critical volume.

5. The computer program product according to claim 4 wherein the critical volume is between shapes on a plurality of levels.

6. The computer program product of claim 2 wherein the defect is at a location on a portion the semiconductor chip that is represented by layout for the semiconductor circuit.

7. The computer program product of claim 2 that further causes the processor to import a schematic for the semiconductor circuit and to cross map between two of a group comprising the netlist, the schematic, and layout for the semiconductor circuit.

8. The computer program product of claim 2 that further causes the processor to identify an intersection of nets based on a failure of electrical operation.

9. The computer program product according to claim 8 wherein the obtaining of the images is based on the intersection of the nets which were identified.

10. The computer program product of claim 2 that further causes the processor to filter out defects smaller than a critical volume.

11. The computer program product of claim 2 that further causes the processor to use an uncertainty value for a location to determine a range of possible defect locations in a layout for the semiconductor circuit.

12. The computer program product according to claim 11 that further causes the processor to analyze the possible defect locations for impact to operation of the semiconductor circuit.

13. The computer program product of claim 2 that further causes the processor to search through layout for similar geometries to a portion of the semiconductor chip where the defect was detected.

14. The computer program product according to claim 2 wherein the detecting the defect is accomplished inline during semiconductor manufacturing.

15. The computer program product according to claim 2 wherein the defect is emphasized using voltage contrast.

16. The computer program product according to claim 2 that further causes the processor to rank the defect and a second defect based on their impact to operation of the semiconductor circuit.

17. The computer program product according to claim 2 that further causes the processor to correlate an impact of the defect on electrical operation of the semiconductor circuit.

18. The computer program product of claim 2 that further causes the processor to classify the defect to identify the defect as a resistive short.

19. The computer program product of claim 2 that further causes the processor to filter defects in the images of the semiconductor chip based on size as compared to a critical dimension.

20. The computer program product of claim 2 that further causes the processor to determine a range of possible defect locations using an uncertainty value.

21. The computer program product of claim 20 wherein the uncertainty value is based on image location.

22. A computer-implemented method of defect characterization comprising:
    inspecting images of a semiconductor chip which comprises a semiconductor circuit during fabrication to look for an anomaly in the images by comparing the images to known good images, resulting in detecting a defect in the images wherein the detecting includes detecting where the defect is larger than a critical dimension in one of the images of the semiconductor chip;
    using a schematic for the semiconductor circuit and cross mapping between the schematic and a netlist or a layout for the semiconductor circuit; and
    performing, using one or more processors, electrical analysis of the netlist with the defect which was detected.

23. The method of claim 22 further comprising performing electrical simulation of the netlist, for the semiconductor circuit with the defect wherein the electrical simulation includes a range of resistive shorts for the defect.

24. The method of claim 23 further comprising ranking the defect and a second defect based on their impact to operation of the semiconductor circuit.

25. A computer system for defect characterization comprising:
    a memory for storing instructions;
    one or more processors coupled to the memory wherein the one or more processors, when executing the instructions which are stored, are configured to:
        inspect images of a semiconductor chip comprising a semiconductor circuit during fabrication to look for an anomaly in the images by comparing the images to known good images, resulting in detecting a defect in one of the images wherein detection includes detecting where the defect is larger than a critical dimension in one of the images of the semiconductor chip;
        use a schematic for the semiconductor circuit and cross map between the schematic and a netlist or a layout for the semiconductor circuit; and
        perform electrical analysis of the netlist with the defect which was detected.

26. The system of claim 25 wherein the one or more processors are further configured to perform electrical simulation of the netlist, for the semiconductor circuit with the defect wherein the electrical simulation includes a range of resistive shorts for the defect.

27. The system of claim 26 wherein the one or more processors are further configured to rank the defect and a second defect based on their impact to operation of the semiconductor circuit.

* * * * *